US006287907B1

(12) United States Patent
Ito et al.

(10) Patent No.: US 6,287,907 B1
(45) Date of Patent: Sep. 11, 2001

(54) METHOD OF MANUFACTURING A FLASH MEMORY HAVING A SELECT TRANSISTOR

(75) Inventors: Hiroshi Ito; Isami Sakai, both of Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/447,869

(22) Filed: Nov. 23, 1999

(30) Foreign Application Priority Data

Nov. 26, 1998 (JP) ................................................. 10-335835

(51) Int. Cl.[7] .............................................. H01L 21/8238
(52) U.S. Cl. .......................... 438/201; 438/211; 438/241; 438/257
(58) Field of Search .................................. 257/314, 315, 257/316, 326; 438/201, 211, 241, 257, 258, 266; 365/185.01, 185.07

(56) References Cited

U.S. PATENT DOCUMENTS

| 5,066,992 | 11/1991 | Wu et al. . | |
|---|---|---|---|
| 5,235,200 | 8/1993 | Komori et al. . | |
| 5,273,923 | * 12/1993 | Chang et al. | 438/264 |
| 5,497,018 | 3/1996 | Kajita . | |
| 5,668,035 | * 9/1997 | Fang et al. | 438/239 |
| 5,907,171 | * 5/1999 | Santin et al. | 257/315 |
| 6,037,222 | * 3/2000 | Huang et al. | 438/257 |
| 6,166,419 | * 12/2000 | Araki | 257/500 |

FOREIGN PATENT DOCUMENTS

| 0395084 A2 | 10/1990 | (EP) . |
| 5-121700 | 5/1993 | (JP) . |
| 8-55920 | 2/1996 | (JP) . |
| 8-70055 | 3/1996 | (JP) . |
| 9-181282 | 7/1997 | (JP) . |

* cited by examiner

*Primary Examiner*—Olik Chaudhuri
*Assistant Examiner*—Hoai Pham

(57) ABSTRACT

According to the present invention, there is disclosed a 2-transistors type flash memory, wherein a memory-transistor is composed of layers of structure consisting of a floating gate and a control gate separated by a first insulating film; and, at least, a gate electrode of a select-transistor is composed of a single layer of a polysilicon film, which is formed from the same layer as the floating gate electrode of the memory-transistor and then doped to have an enhanced dopant concentration by ion implantation performed in the step of forming source-drain regions of the transistors

4 Claims, 18 Drawing Sheets

FLASH MEMORY AREA ←→ LOGIC AREA

FLASH MEMORY AREA ↔ LOGIC AREA

Memory-Tr  Select-Tr    Logic-Tr

Prior Art

FLASH MEMORY AREA ↔ LOGIC AREA

Prior Art

Prior Art

Prior Art

Prior Art

Memory-Tr  Select-Tr    Logic-Tr

METHOD OF MANUFACTURING A FLASH MEMORY HAVING A SELECT TRANSISTOR

BACKGROUND OF THE INVENTION

1. Field of the Invention

The present invention relates to a semiconductor device and a manufacturing method thereof and more particularly to improvements in a gate electrode of a select-transistor in a 2-transistors type flash memory.

2. Description of the Related Art

An electrically-erasable nonvolatile semiconductor memory device such as a FLASHEEPROM (Flash Electrically-Erasable Programmable Read Only Memory) comprises two sorts of transistors, the memory-transistor and the select-transistor. A plurality of memory-transistors each of which has a floating gate electrode (FGE) and a control gate electrode (CGE) are formed in a memory cell area thereof and are under control as well as selection of a select-transistor. Further, in a more practically designed FLASHEEPROM, a transistor in a logic area such as the one in a logical operation circuit is also formed on the same substrate.

For such a FLASHEEPROM as having a logic transistor on the same substrate, a gate electrode of the logic transistor and a CGE in the memory cell area are formed from the same layer in the manufacturing method generally used. Referring to the drawings, a conventional manufacturing method is described below.

FIGS. 3(1) to 3(20) are a series of schematic cross-sectional views illustrating the steps of a conventional method of manufacturing a FLASHEEPROM.

First, upon a P-type semiconductor substrate 1, a first P-well 2 and a second P-well 3 are formed in a flash memory area and a logic area, respectively. Next, a field oxide film 4 that defines areas of elements is formed, and thereafter an oxide film 5 with a thickness of 8 to 10 nm is formed on the surface of the substrate 1 by the thermal oxidation method (FIG. 3(1)). A first N$^-$-type polysilicon 7 that is to become a FGE material in the flash memory area is formed thereon to a thickness of 150 nm. After that, by means of ion implantation, phosphorus is injected thereinto to a dopant concentration of approximately 1 to $3 \times 10^{19}$ atoms /cm$^3$ (FIG. 3(2)). Next, in order to maintain said polysilicon only on the oxide film in the flash memory area, a photoresist 6a is formed into the pattern (FIG. 3(3)) and, using this as a mask, etching is applied thereto (FIG. 3(4)).

Next, covering said polysilicon, an ONO (Oxide-Nitride-Oxide) film 8 is grown over the entire surface to a thickness of 12 to 16 nm in terms of oxide film thickness by the CVD (Chemical Vapour Deposition) method (FIG. 3(5)). Over that, a photoresist 6b is then applied and patterned so as to cover only the flash memory area (FIG. 3(6)), and thereafter etching of said ONO film is performed. At this, the oxide film 5 in the logic area is concurrently once removed (FIG. 3(7)), and a gate oxide film with a thickness of 5 nm, for example, is subsequently formed again in the logic area (FIG. 3(8)).

Over the entire surface of the substrate, a second polysilicon 9 that is to become a CGE material as well as a material for a gate electrode in the logic area is grown to a thickness of 200 nm (FIG. 3(9)). Following that, on said second polysilicon 9, a photoresist 6c is formed into the pattern of electrodes of a memory-transistor and a select-transistor in the flash memory area, and formed over the entire surface, in the logic area (FIG. 3(10)). Etching is then applied to the second polysilicon 9, the ONO film 8 in the flash memory area and the first polysilicon 7 (FIG. 3(11)).

Next, in order to form a first LDD (Lightly-Doped Drain) structure 11 in the flash memory area, arsenic (As) or phosphorus (P) is ion-implanted thereinto with a dose of approximately $1 \times 10^{13}$ to $1 \times 10^{14}$ atoms/cm$^2$. For this, the entire surface of the logic area is masked with a photoresist 6d (FIG. 3(12)). After that, to form a logic-transistor, a photoresist 6e is formed into the pattern of the entire surface of the flash memory area and of the transistor of the logic area by means of patterning (FIG. 3(13)). The subsequent etching applied thereto forms a gate electrode of the transistor in the logic area (FIG. 3(14)).

Further, for the formation of a second LDD 12 in the logic area, the entire surface of the flash memory area is again covered with a photoresist 6f and, then, As or P is ion-implanted thereinto with a dose of approximately $1 \times 10^{13}$ to $1 \times 10^{14}$ atoms/cm$^2$ (FIG. 3(15)).

After removing the photoresist, anoxide film is formed over the entire surface, and there from sidewalls 13 are formed on lateral faces of the electrode materials in the flash memory area and in the logic area (FIG. 3(16)). Following that, to form source-drain (SD) regions 14 in the flash memory area and in the logic area, As is ion-implanted thereinto with a dose of approximately $1 \times 10^{15}$ to $5 \times 10^{15}$ atoms/cm$^2$ (FIG. 3(17)).

Next, the oxide film lying outside of the transistors is all removed by wet etching (FIG. 3(18)) and then a titanium (Ti) film 15 is grown over the entire surface (FIG. 3(19)). Finally, by performing a salicide process in which titanium is turned to silicide and removing unreacted parts of the Ti film 15 subsequently, silicide films 16 are selectively formed on the SD regions of the P-type substrate 1 as well as on the polysilicons of the transistors, and thereby a semiconductor device having a memory-transistor (Tr) and a select-transistor (Tr) in the flash memory area and a logic-transistor (Tr) in the logic area is accomplished (FIG. 3(20)).

In the flash memory formed in such a way as described above, the first polysilicon 7 for the gate electrode of the select-transistor is not N$^+$-type but N$^-$-type so that holding characteristics of the flash memory does not become deteriorated. The use of N$^-$-type, however, brings about significant gate depletion, which results in an increase in effective thickness of the oxide film and a lowering of the operational speed. Obviously with this manufacturing method, it is impossible to add the dopants to increase the dopant concentration in the first polysilicon 7 (to make it N$^+$-type) so that the operational speed thereof cannot be improved further. Moreover, since the first polysilicon 7 which is the gate electrode of the select-transistor is not turned to silicide and is insulated by the ONO film 8 from the second polysilicon 9 that is turned to silicide, the resistance thereof is considerable. This gives rise to a problem that the voltage applied substantially to the gate of the select-transistor varies from cell to cell and, therefore, the ON-current of the select-transistor varies with the cell.

It is reported that there have been an attempt to form a butting contact on an ONO film of a select-transistor so as to make electrical connection between the upper and the lower electrode layers. In this case, it is necessary to add the step of forming said contact into the manufacturing method thereof, which undoubtedly complicates the steps but its effect of reducing the gate resistance is not particularly promising so far.

Meanwhile, in JP-A-5-121700, with the object of lowering the resistance of the select-transistor enough to achieve a higher operational speed, there is disclosed a structure in which a select-transistor has a gate electrode formed in such a way that a silicon film either interposing a metal silicide film therebetween or having a silicide surface thereof is formed into the shape of a sidewall on the lateral face of a gate electrode of a memory-transistor, and an adjacent circuit transistor has a gate electrode formed from the same layer as said gate electrode of the select-transistor.

In the method described in said publication, however, conductive layers of polysilicon or the like must be formed twice for the formation of the gate electrode of the memory-transistor and once more for the formation of the select-transistor and the adjacent circuit transistor. Furthermore, there are problems that, because of an insulating film present between the select-transistor and the memory-transistor, no channel is formed under that insulating film and that the gate oxide film of the select-transistor becomes thicker than the gate oxide film of the memory-transistor, which inevitably hinders the improvement of the operational speed.

Further, in JP-A-9-181282, there is disclosed a method of manufacturing a flash memory element, wherein, after a first polysilicon such as described above and an ONO film are formed, the ONO film lying in a select-transistor area and an adjacent circuit transistor area is removed by means of photolithography, and thereafter a second polysilicon is grown and, its surface being turned to silicide, patterning is applied thereto to form the shape of gate electrodes of a memory-transistor, a select-transistor and an adjacent circuit transistor, and then the ion implantation is carried out to form source-drain regions. In this method, the structure of the select-transistor is formed by patterning that is performed when a floating gate and a control gate of the select-transistor are directly contacted with each other. This produces an effect of lowering the gate resistance and, thus, making formation of a buttering contact as described above unnecessary.

In this method, however, concentrations of the implanted dopants are different between the floating gate and the control gate, while they are in contact with each other, so that the depletion of the underlying floating gate cannot be eliminated thoroughly. In general, the dopant concentration within a polysilicon layer is made uniform through thermal diffusion. In the case that a polysilicon layer is laid over another polysilicon layer, however, the surface of the lower layer is exposed to the air during the step of forming the upper layer, which leads to the formation of a thin natural oxidation film. Though 1 to 2 nm thick at the most, this natural oxidation film makes the dopant diffusion still slower by its presence. In addition, when two layers of polysilicon are formed, the grain boundaries of polysilicon layers do not usually meet on the composition plane and this further hinders the dopant diffusion. For instance, if the RTA (Rapid Thermal Annealing) treatment performed at 1020° C. for 10 seconds or so is sufficient for a single-layered polysilicon, the RTA treatment at the same temperature must be carried out for as long as 40 seconds for a double-layered polysilicon such as the one described herein. In other words, to attain diffusion within the gate polysilicon in this instance, while it takes 10 seconds in a single layer, it requires 40 seconds in a double layer. Consequently, in a transistor with a double-layered structure, the diffusion in the transverse direction within the LDD becomes more marked and the effective channel length, shorter. In short, the double layer is not suited for the miniaturization, because of its substantial short channel effect.

Further, since the step of another photolithography is added to remove the ONO film lying in the select-transistor area and the adjacent circuit transistor area, another problem of further complicating steps also arises for this method.

SUMMARY OF THE INVENTION

Accordingly, an object of the present invention is to provide a nonvolatile memory semiconductor device having, on one and the same substrate, a flash memory area where a memory-transistor and a select-transistor are formed and a logic area where an adjacent circuit transistor is formed; which has a transistor structure capable to suppress the gate depletion particularly in the select-transistor and to perform high speed operations, all without making the steps of manufacturing method thereof unduly complicated.

In accordance with the present invention, there are presented the following structures and manufacturing methods thereof:

A nonvolatile memory semiconductor device having, on one and the same substrate, a flash memory area where a memory-transistor and a select-transistor are formed and a logic area where an adjacent circuit transistor is formed; wherein:

said memory-transistor is composed of layers of structure consisting of a floating gate and a control gate separated by a first insulating film; and at least, a gate electrode of the select-transistor is composed of a single layer of a polysilicon film, which is formed from the same layer as the floating gate of the memory-transistor and then doped to have an enhanced dopant concentration by ion implantation performed in the step of forming source-drain regions of the transistors.

The afore-mentioned semiconductor device, wherein a gate electrode of the adjacent circuit transistor in the logic area is composed of a single layer of a polysilicon film, which is formed from the same layer as the floating gate of the memory-transistor and then doped to have an enhanced dopant concentration by ion implantation performed in the step of forming source-drain regions of the transistors.

The afore-mentioned semiconductor device, wherein a gate electrode of the adjacent circuit transistor in the logic area is composed of a single layer being formed from the same layer as the control gate electrode of the memory-transistor.

The afore-mentioned semiconductor device, wherein the surface of the control gate of the memory-transistor and the surfaces of the gate electrodes of the select-transistor and of the adjacent circuit transistor in the logic area have undergone the chemical change to silicide.

The afore-mentioned semiconductor device, wherein a sidewall is formed on each lateral face of the gate electrode of each transistor and an LDD structure is each formed in the substrate under said sidewall.

A method of manufacturing a nonvolatile memory semiconductor device having, on one and the same substrate, a flash memory area where a memory-transistor and a select-transistor are formed and a logic area where an adjacent circuit transistor is formed; which, at least, comprises the steps of:

(1) growing an N-type first polysilicon upon a semiconductor substrate on which an element isolation region and an oxide film are formed;

(2) removing the first polysilicon overlying the element isolation region by etching;

(3) growing a first insulating film over the entire surface so as to cover the remaining first polysilicon;

(4) growing a second polysilicon as well as a nitride film over the entire surface;

(5) forming a resist pattern at the position where electrodes of the memory-transistor are to be formed and, then, with said pattern used as a mask, carrying out etching of the nitride film, the second polysilicon and the first polysilicon;

(6) removing the resist pattern, and thereafter forming another resist pattern at the positions where electrodes of the select-transistor and the adjacent circuit transistor are to be formed and, then, with said nitride film used as a mask for the memory-transistor and said pattern, for the select-transistor and the adjacent circuit transistor, carrying out etching of the first polysilicon;

(7) removing said nitride film as well as said resist pattern, and thereafter, concurrently with forming source-drain regions, applying ion implantation to the second polysilicon which is to serve as a control gate of the memory-transistor and to the first polysilicon which is to serve as gate electrodes of the select-transistor and of the adjacent circuit transistor in the logic area; and (8) removing, by means of isotropic etching, the oxide film lying on the substrate surface other than the parts thereof underlying every transistor, to the level where the substrate surface is exposed.

The afore-mentioned method of manufacturing a semiconductor device, which further comprises the step of injecting dopants by ion implantation after growing said N⁻-type first polysilicon.

The afore-mentioned method of manufacturing a semiconductor device, which, after said step (8), further comprises the step of:

(9) growing a metal film over the entire surface for the silicide formation, and thereafter subjecting that to the chemical change to silicide and then removing the unreacted metal film.

The afore-mentioned method of manufacturing a semiconductor device, wherein said step (7) comprises the substeps of removing said nitride film as well as resist pattern and then performing the first ion implantation to form an LDD structure in the flash memory area, with another resist masking the entire surface of the logic area; removing the resist in the logic area and then performing the second ion implantation to form an LDD structure in the logic area, with another resist masking the entire surface of the flash memory area; and, in addition, forming sidewalls prior to another ion implantation to form source-drain regions.

A method of manufacturing a nonvolatile memory semiconductor device having, on one and the same substrate, a flash memory area where a memory-transistor and a select-transistor are formed and a logic area where an adjacent circuit transistor is formed; which, at least, comprises the steps of:

(1) growing an N-type first polysilicon upon a semiconductor substrate on which an element isolation region and an oxide film are formed;

(2) removing the first polysilicon overlying the element isolation region as well as the logic area by etching;

(3) growing a first insulating film over the entire surface so as to cover the remaining first polysilicon;

(4) removing, at least, the first insulating film in the logic area;

(5) growing a second polysilicon as well as a nitride film over the entire surface;

(6) forming a resist pattern at the positions where electrodes of the memory-transistor and the adjacent circuit transistor are to be formed and, then, with said pattern used as a mask, carrying out etching of the nitride film and the second polysilicon;

(7) removing the resist pattern, and thereafter forming another resist pattern at the position where an electrode of the select-transistor is to be formed as well as on the entire surface of the logic area, and, then, with said nitride film used as a mask for the memory-transistor and said pattern, for the select-transistor, carrying out etching of the first insulating film and the first polysilicon;

(8) removing said nitride film as well as said resist pattern, and thereafter, concurrently with forming source-drain regions, applying ion implantation to the second polysilicon which is to serve as a control gate of the memory-transistor and as a gate electrode of the adjacent circuit transistor in the logic area and to the first polysilicon which is to serve as a gate electrode of the select-transistor; and (9) removing, by means of isotropic etching, the oxide film lying on the substrate surface other than the parts thereof underlying every transistor, to the level where the substrate surface is exposed.

The afore-mentioned method of manufacturing a semiconductor device, which further comprises the step of injecting dopants by ion implantation after growing said N⁻-type first polysilicon.

The afore-mentioned method of manufacturing a semiconductor device, which, after said step (9), further comprises the step of:

(10) growing a metal film over the entire surface for the silicide formation, and thereafter subjecting that to the chemical change to silicide and then removing the unreacted metal film.

The afore-mentioned method of manufacturing a semiconductor device, wherein said step (8) comprises the substeps of performing the first ion implantation to form an LDD structure in the flash memory area before removing said nitride film and resist pattern; removing said nitride film and resist and then performing the second ion implantation to form an LDD structure in the logic area, with another resist masking the entire surface of the flash memory area; and, in addition, forming sidewalls prior to another ion implantation to form flash memory area; and, in addition, forming sidewalls prior to another ion implantation to form source-drain regions.

According to the present invention, the gate electrode of the select-transistor produced in the flash memory area is composed of a single layer of a polysilicon film, which is formed from the same layer as the floating gate electrode of the memory-transistor and then doped to have an enhanced dopant concentration by ion implantation performed in the step of forming source-drain regions of the transistors, and therefore a select-transistor structure capable of high speed operations is provided. Furthermore, because of silicide formation on the gate surface of the select-transistor, the voltage applied substantially to the gate of the select-transistor becomes almost identical for every cell so that the problem associated with the conventional structure that the ON-current of the select-transistor varies with the cell is also eliminated.

Further, in the manufacturing method of the present invention, a simple addition of the step of forming a nitride film over the second polysilicon makes it unnecessary to add the step of troublesome photolithography which is required, in the conventional method, to perform in the later step, in removing the ONO film lying outside of the memory transistor area, thus, the present invention also has the effect of simplifying the steps thereof.

EXPLANATION OF SYMBOLS

Figure 1:
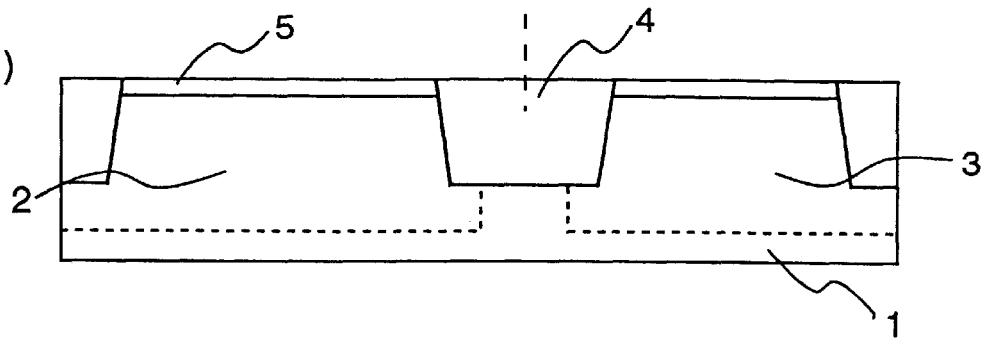
FIGS. 1(1) to 1(20) are a series of schematic cross-sectional views illustrating the steps of a method of manufacturing a FLASHEEPROM that is an embodiment of the present invention.
Figure 1:
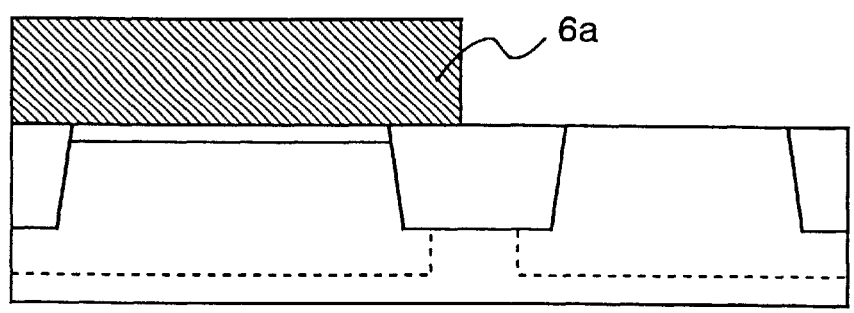
Figure 1:
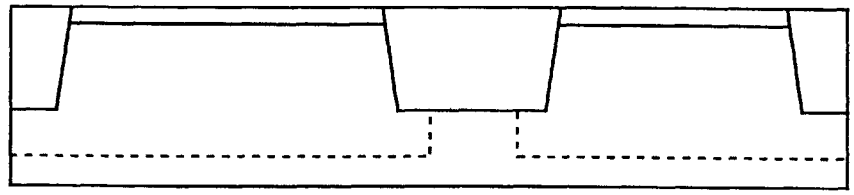
Figure 1:
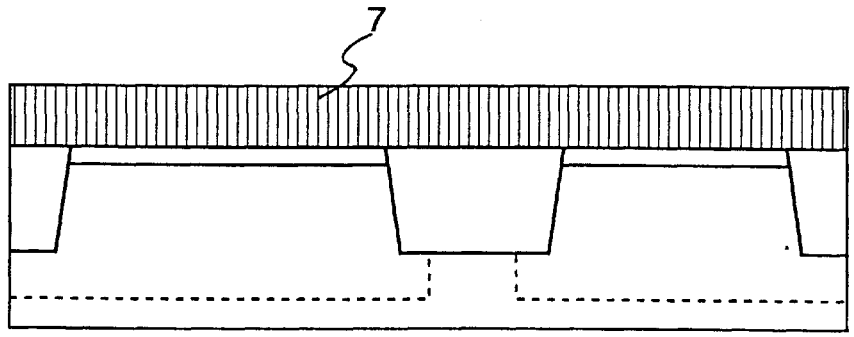
Figure 1:
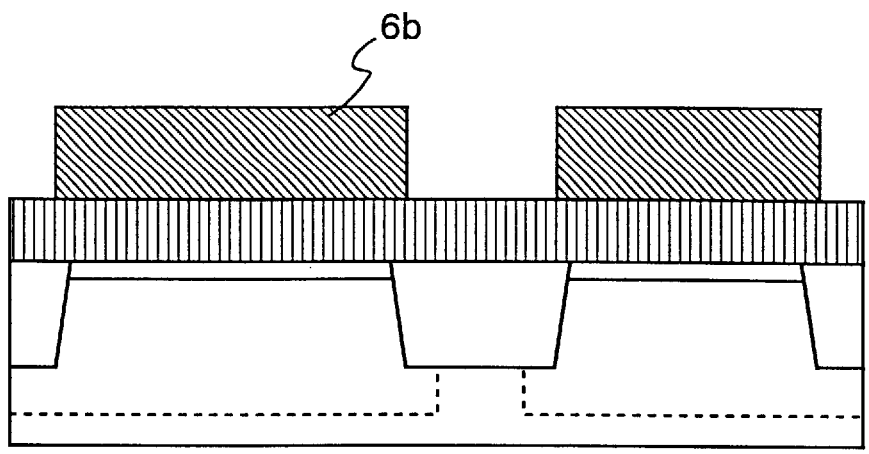
Figure 1:
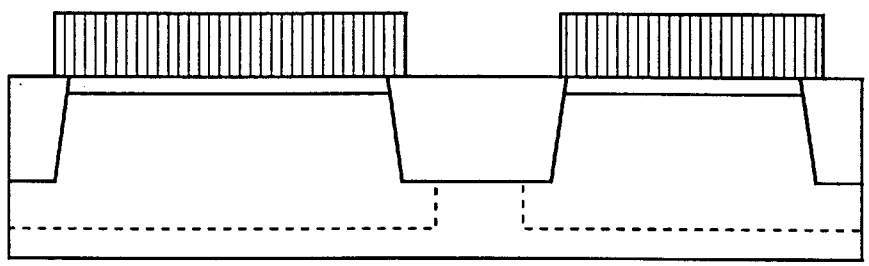
Figure 1:
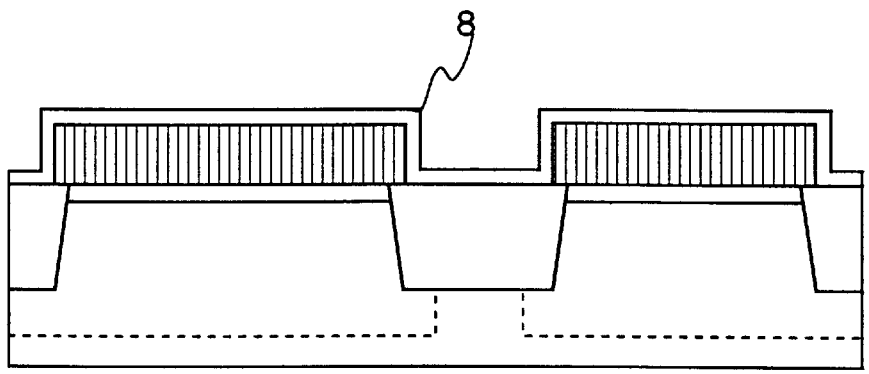
Figure 1:
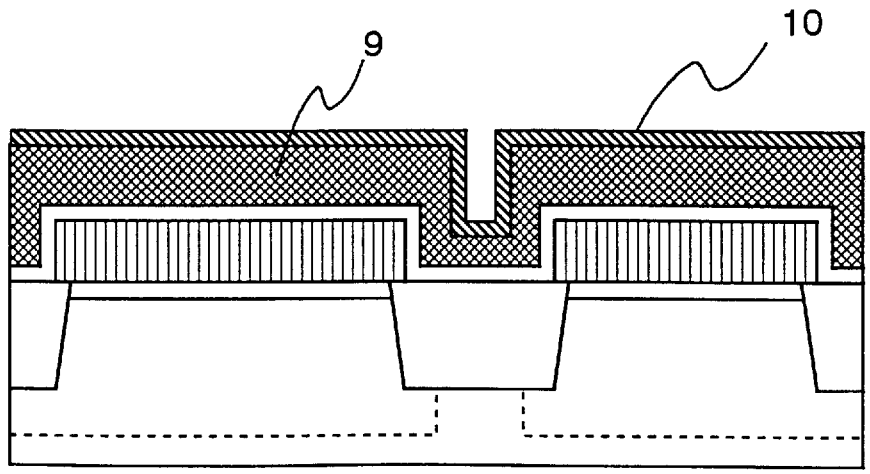
Figure 1:
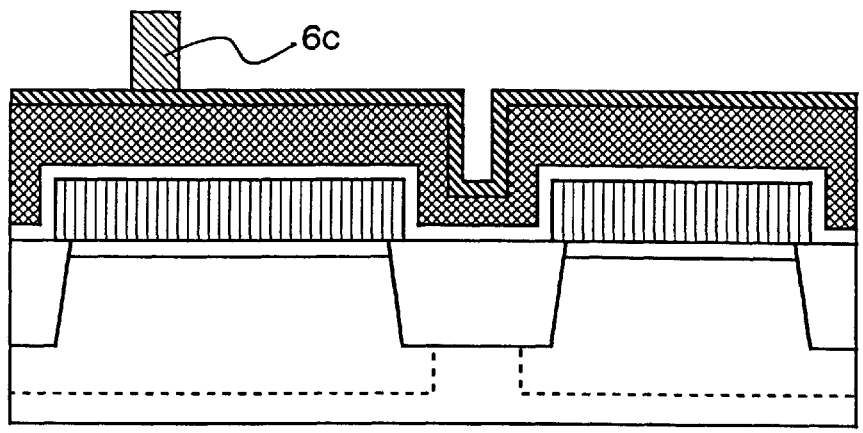
Figure 1:
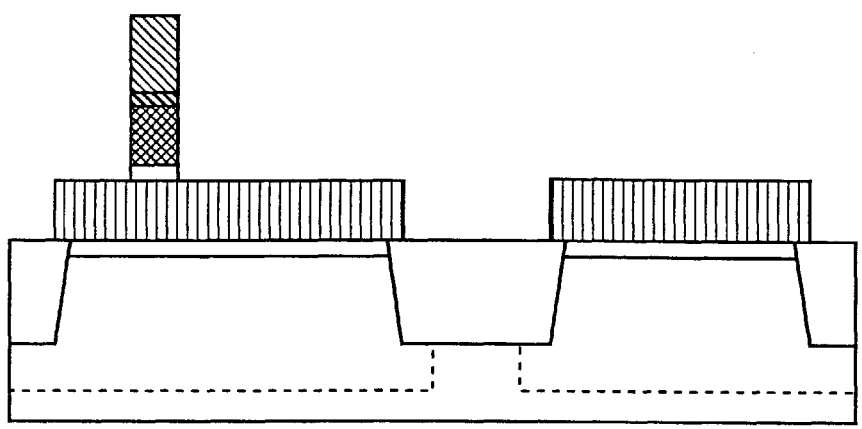
Figure 1:
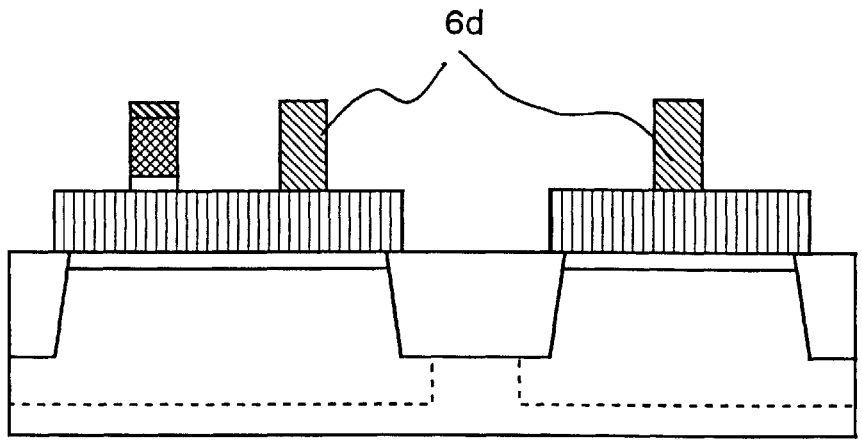
Figure 1:
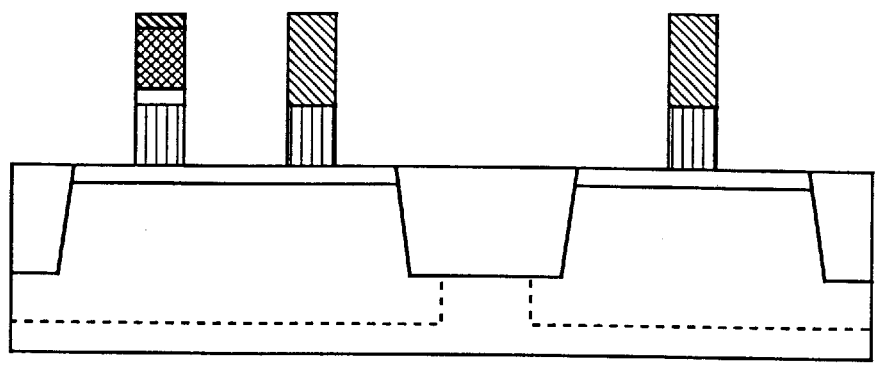
Figure 1:
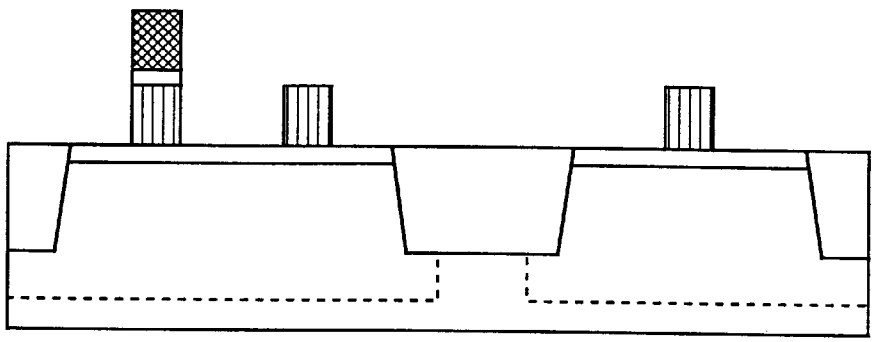
Figure 1:
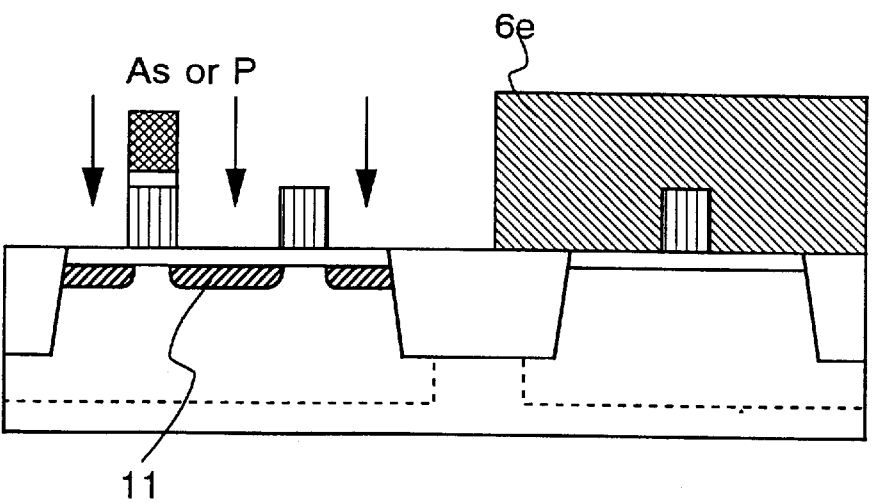
Figure 1:
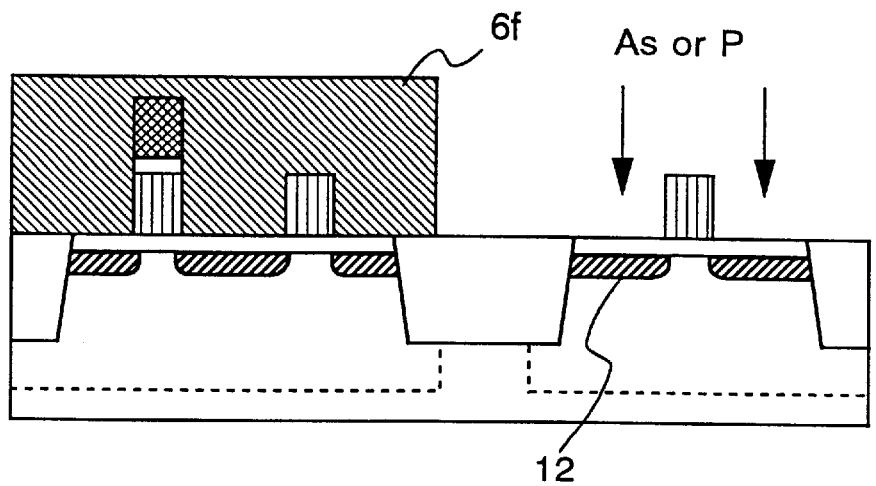
Figure 1:
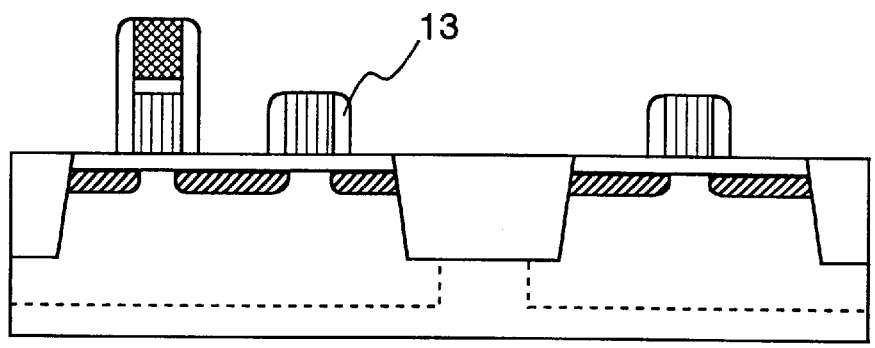
Figure 1:
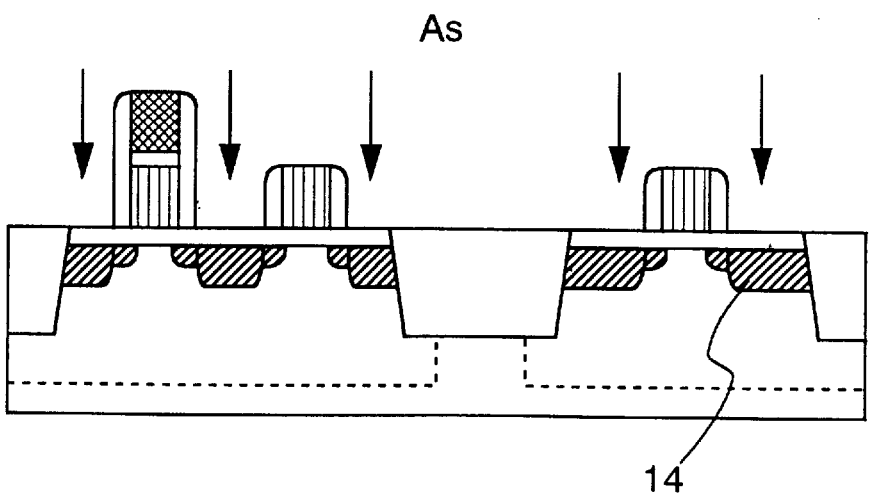
Figure 1:
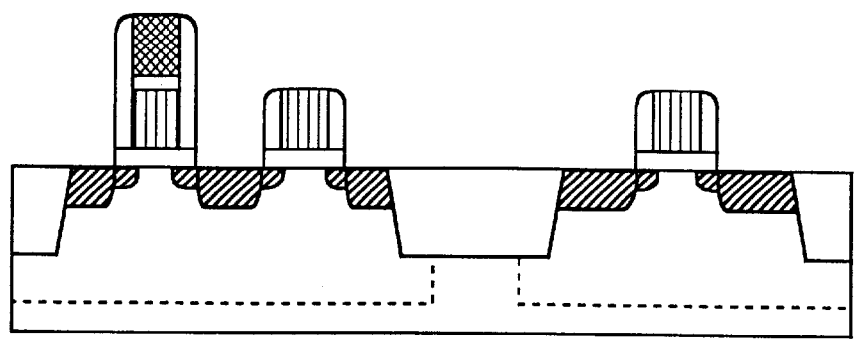
Figure 1:
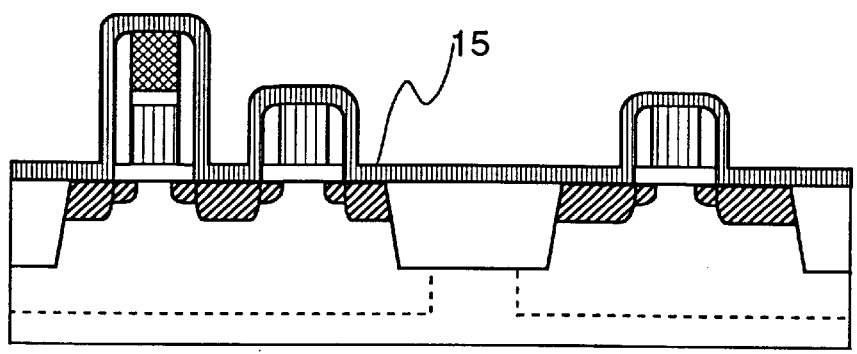
Figure 1:
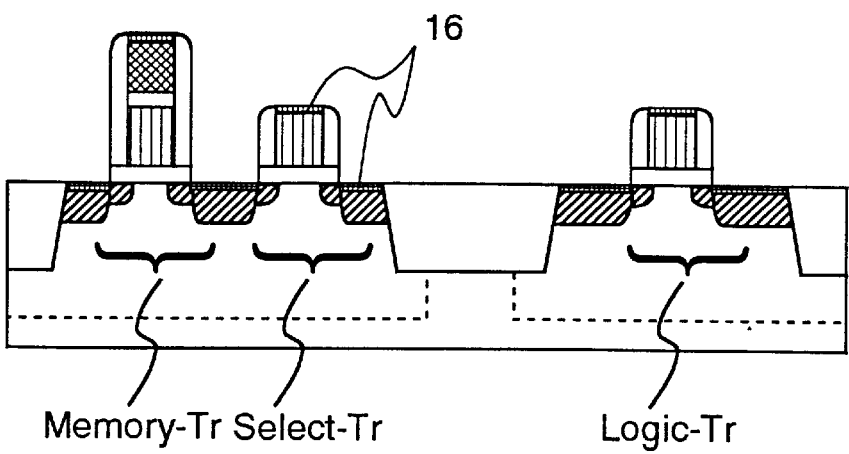

1: P-type substrate;
2: First P-well;
3: Second P-well;
4: Field oxide film;
5: Oxide film;
6: Photoresist;
7: First polysilicon (N⁻);
8: ONO film;
9: Second polysilicon;
10: Nitride film;
11: First LDD;
12: Second LDD;
13: Sidewall;
14: SD region;
15: Titanium film;
16: Silicide film.

DETAILED DESCRIPTION OF THE PREFERRED EMBODIMENTS

Referring to the drawings, the present invention is described in detail below.

FIGS. 1(1) to 1(20) are a series of schematic cross-sectional views illustrating the steps of a method of manufacturing a FLASHEEPROM that is an embodiment of the present invention.

First, upon a P-type semiconductor substrate 1, a first P-well 2 and a second P-well 3 are formed in a flash memory area and a logic area, respectively. Next, a field oxide film 4 that defines areas of elements is formed, and thereafter an oxide film 5 with a thickness of 6 to 8 nm is formed on the surface of the substrate 1 by the thermal oxidation method (FIG. 1(1)). Next, the oxide film overlying the first P-well 2 is covered with a photoresist 6a, and then, after the oxide film overlying the second P-well 3 is once removed (FIG. 1(2)), a gate oxide film with a thickness of 5 nm is again formed by the thermal oxidation method (FIG. 1(3)). Through that, the film thickness of the oxide film in the flash memory area becomes 8 to 10 nm. A first N⁻-type polysilicon 7 that is to become a FGE material in the flash memory area is formed thereon to a thickness of 150 nm. After that, by means of ion implantation, phosphorus is injected thereinto to a dopant concentration of approximately $1 \times 10^{19}$ to $3 \times 10^{19}$ atoms/cm³ (FIG. 1(4)).

Next, in order to remove said first polysilicon film 7 above the element isolation region 2, a photoresist 6b is formed into the pattern on the oxide film in the flash memory area and the logic area (FIG. 1(5)) and, using this as a mask, etching is applied thereto (FIG. 1(6)). Next, covering remaining said polysilicon, an ONO film 8 is grown over the entire surface to a thickness of 12 to 16 nm in terms of oxide film thickness (FIG. 1(7)) and, over this, a second polysilicon 9 is grown to a thickness of 200 nm and then a nitride film 10 that is to serve as an etching mask for a floating gate in the later step is grown (FIG. 1(8)).

Following that, a photoresist pattern 6 corresponding to the shape of an electrode of a memory-transistor in the flash memory area is formed on said nitride film 10 (FIG. 1(9)), and then the nitride film 10, the second polysilicon 9 and the ONO film 8 are etched in succession (FIG. 1(10)). After removing the photoresist, another resist pattern 6c is formed into the shape of a select-transistor gate and an adjacent circuit transistor gate (FIG. 1(11)).

Next, using as a mask said nitride film in the memory-transistor area and the resist pattern, in the other areas, the first polysilicon 7 is etched (FIG. 1(12)). The nitride film as well as the resist are then removed (FIG. 1(13)), and thereafter, in order to form a first LDD structure 11 in the flash memory area, As or P is ion-implanted thereinto with a dose of approximately $1 \times 10^{13}$ to $1 \times 10^{14}$ atoms/cm². For this, the entire surface of the logic area is masked with a photoresist 6d (FIG. 1(14)).

Next, for the formation of a second LDD 12 in the logic area, the resist formed in the logic area is removed and the entire surface of the flash memory area is again covered with a photoresist 6e iand, then, As or P is ion-implanted thereinto with a dose of approximately $1 \times 10^{13}$ to $1 \times 10^{14}$ atoms/cm² (FIG. 1(15)). After removing the photoresist, an oxide film is formed over the entire surface, and therefrom sidewalls 13 are formed on lateral faces of the electrode materials in the flash memory area and in the logic area (FIG. 1(16)). Following that, to form source-drain (SD) regions 14 in the flash memory area and in the logic area, As is ion-implanted thereinto with a dose of approximately $1 \times 10^{15}$ to $5 \times 10^{15}$ atoms /cm² (FIG. 1(17)).

Next, the oxide film lying outside of the transistors is all removed by wet etching (FIG. 1(18)) and then a titanium (Ti) film 15 is grown over the entire surface (FIG. 1(19)). Finally, by performing a salicide process in which titanium is turned to silicide and removing unreacted parts of the Ti film 15 subsequently, silicide films 16 are selectively formed on the SD regions of the P-type substrate 1 as well as on the polysilicons of the transistors, and thereby a semiconductor device having a memory-transistor (Tr) and a select-transistor (Tr) in the flash memory area and a logic-transistor (Tr) in the logic area is accomplished (FIG. 1(20)).

Figure 2:
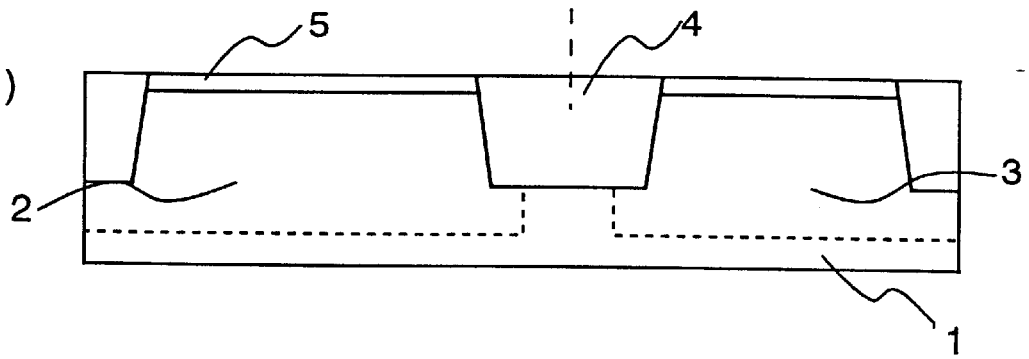
FIGS. 2(1) to 2(20) are a series of schematic cross-sectional views illustrating the steps of a method of manufacturing a FLASHEEPROM that is another embodiment of the present invention.
Figure 2:
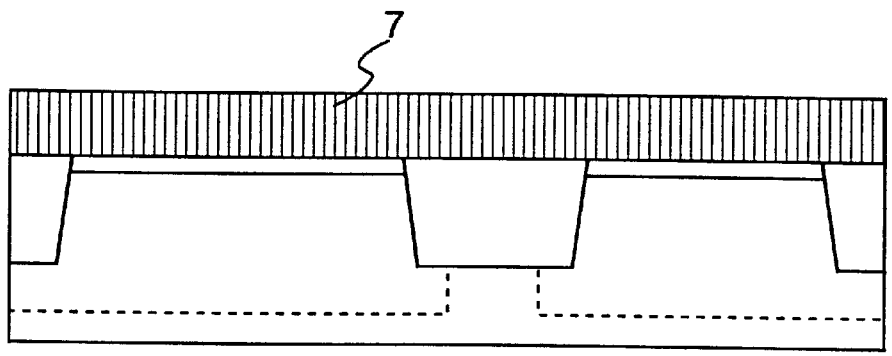
Figure 2:
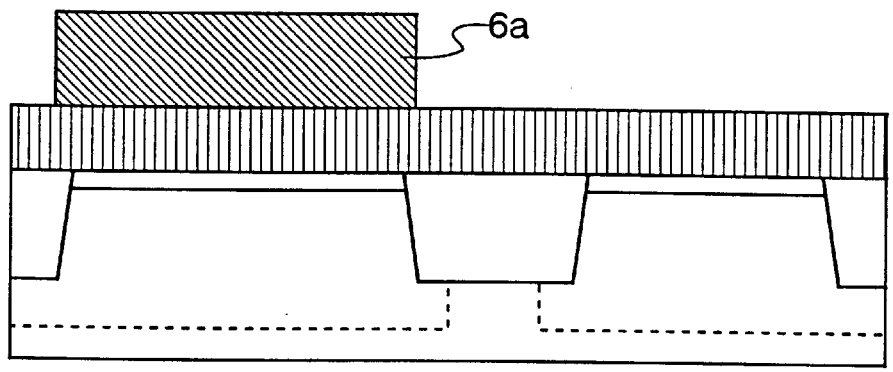
Figure 2:
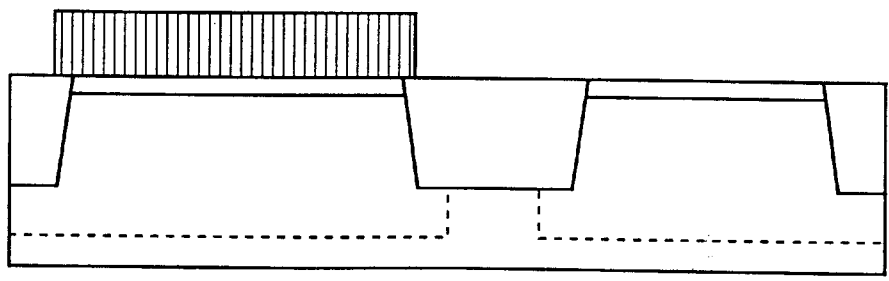
Figure 2:
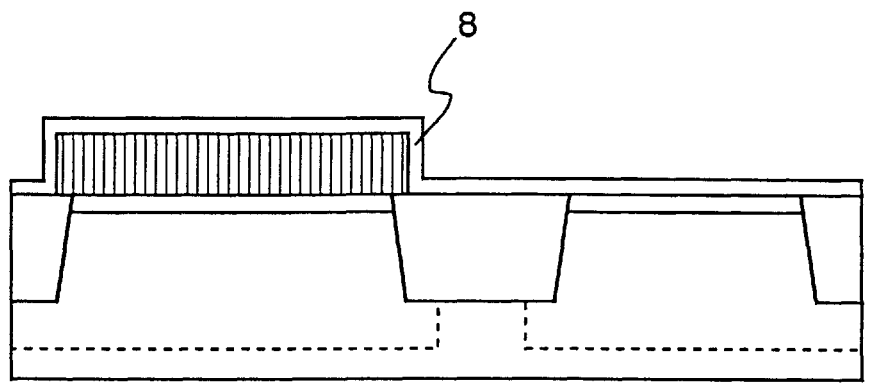
Figure 2:
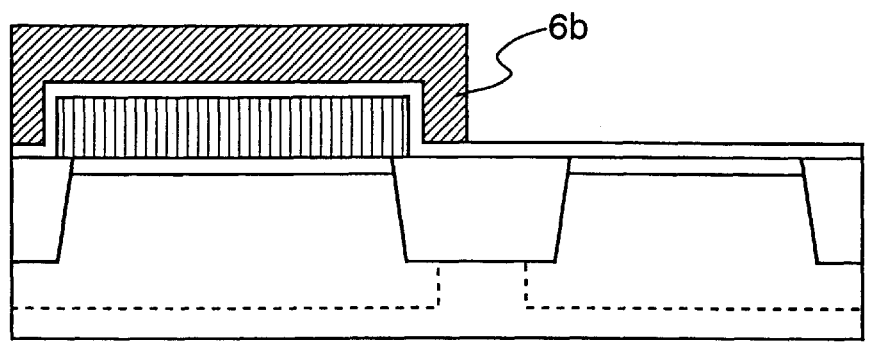
Figure 2:
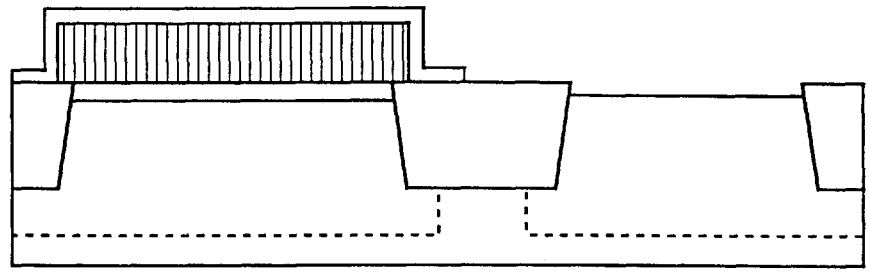
Figure 2:
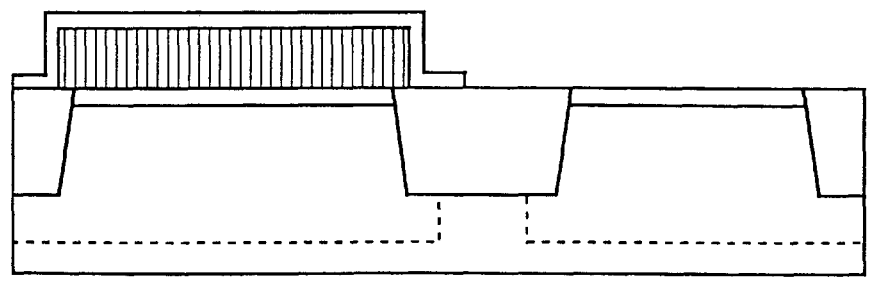
Figure 2:
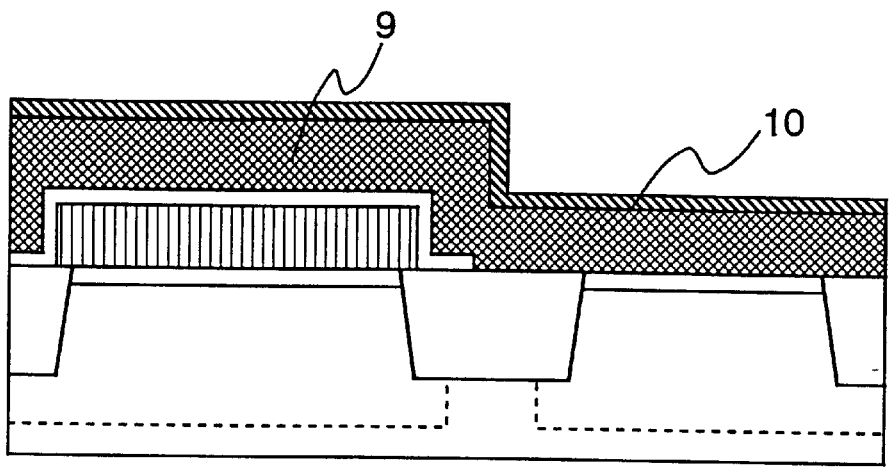
Figure 2:
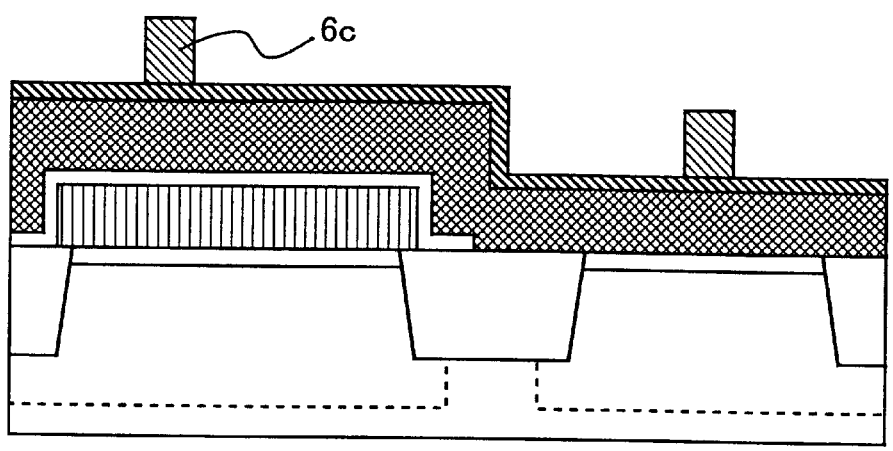
Figure 2:
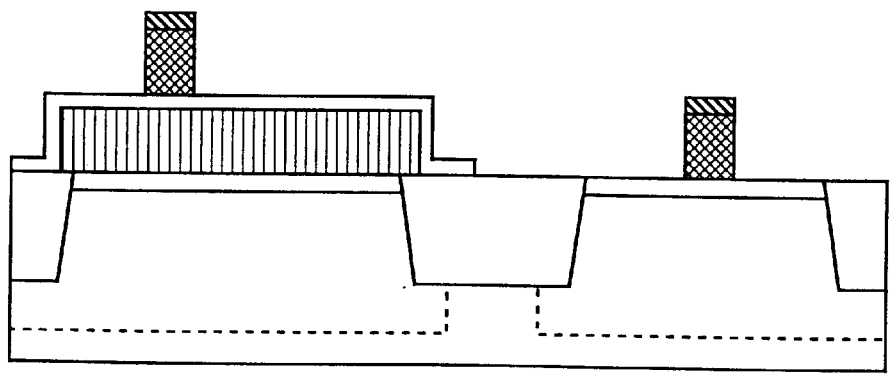
Figure 2:
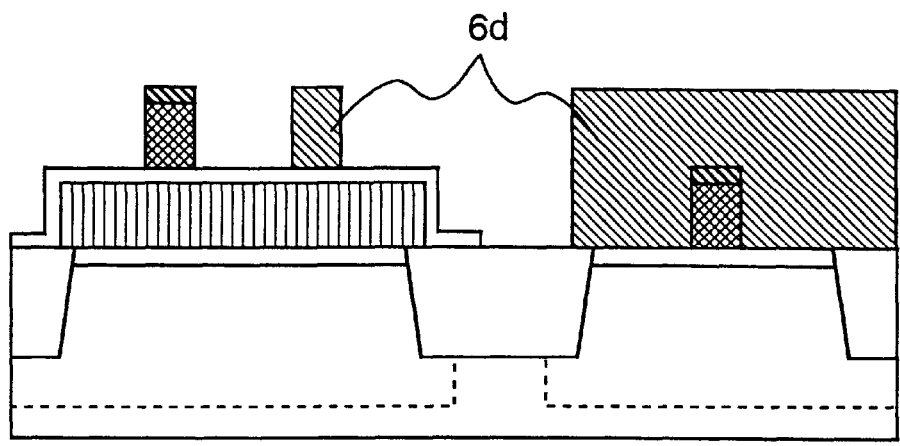
Figure 2:
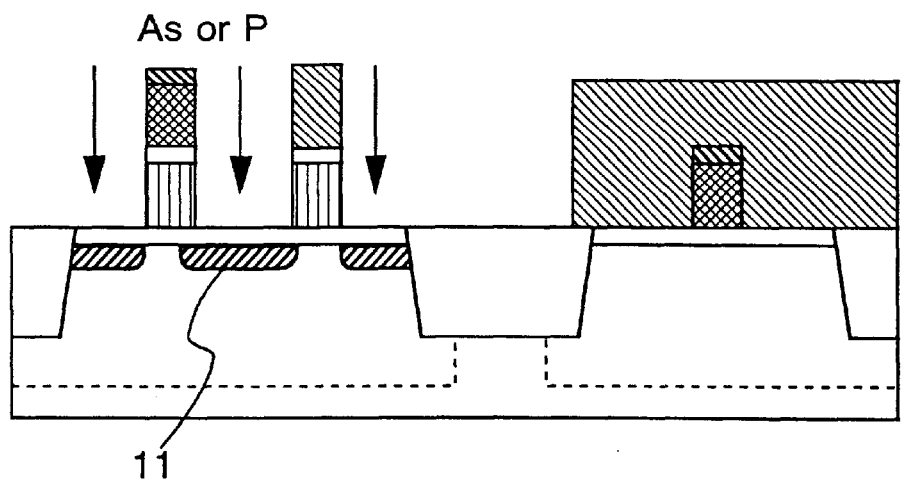
Figure 2:
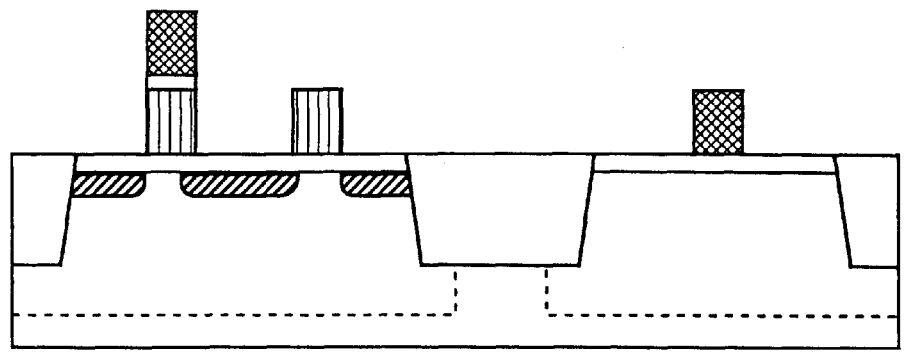
Figure 2:
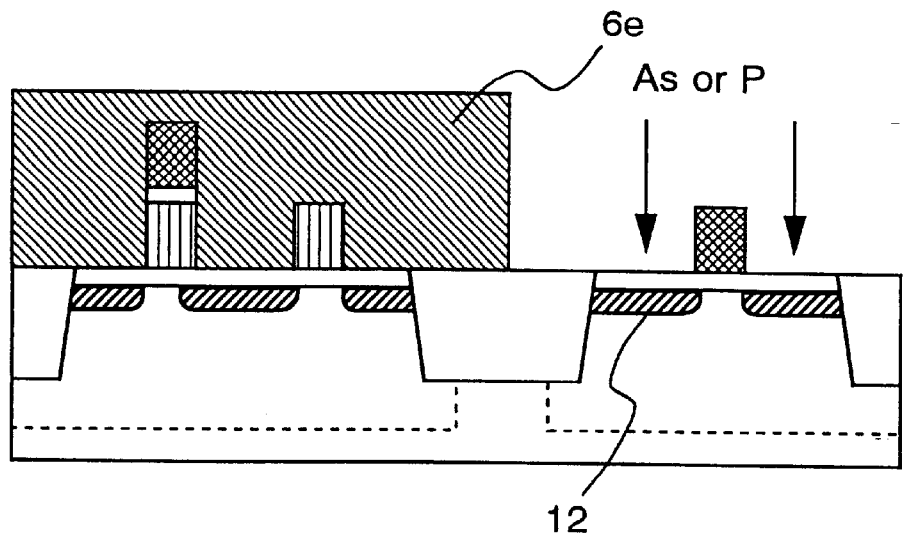
Figure 2:
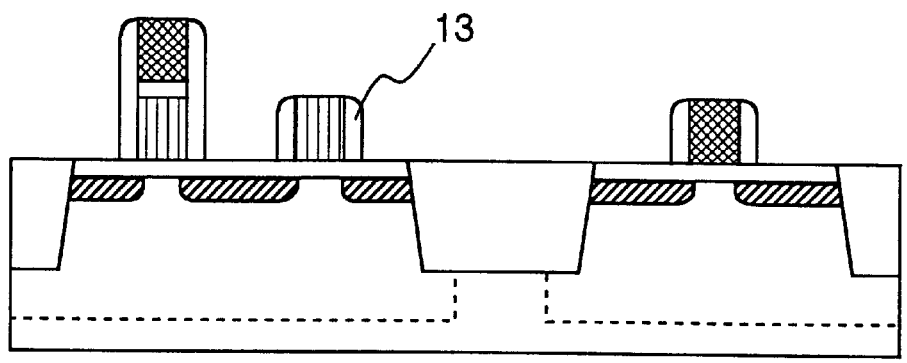
Figure 2:
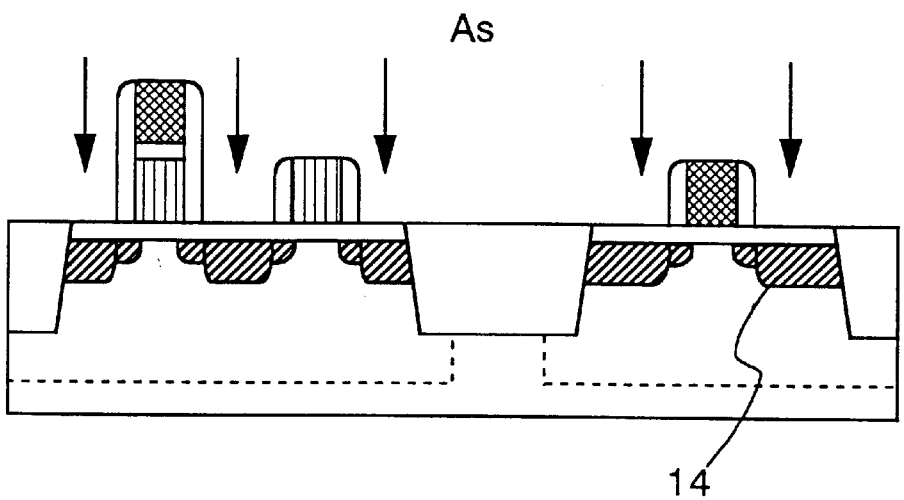
Figure 2:
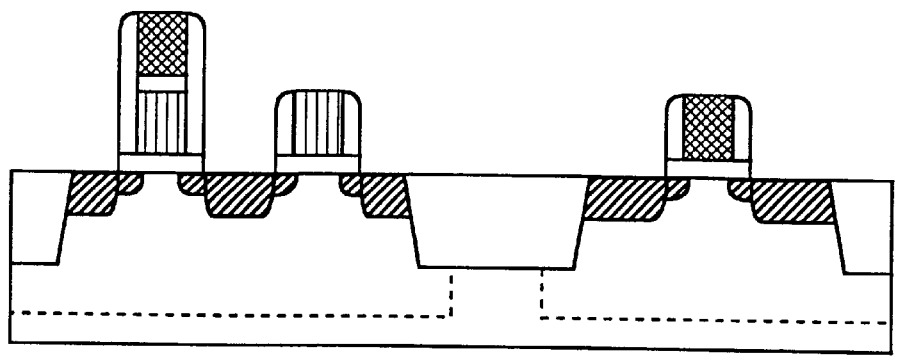
Figure 2:
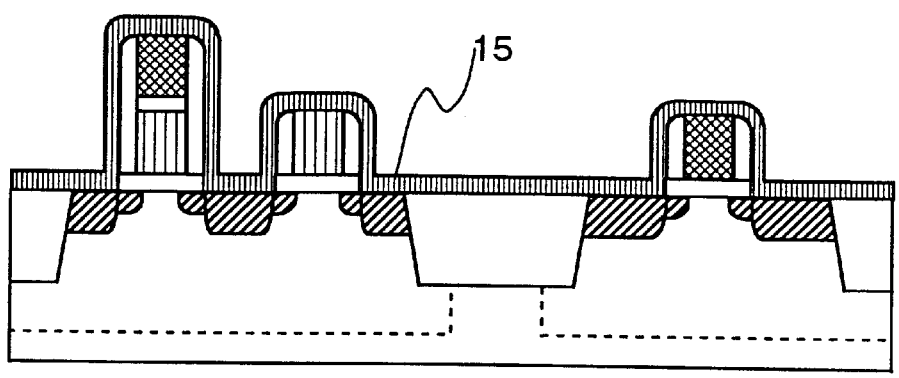
Figure 2:
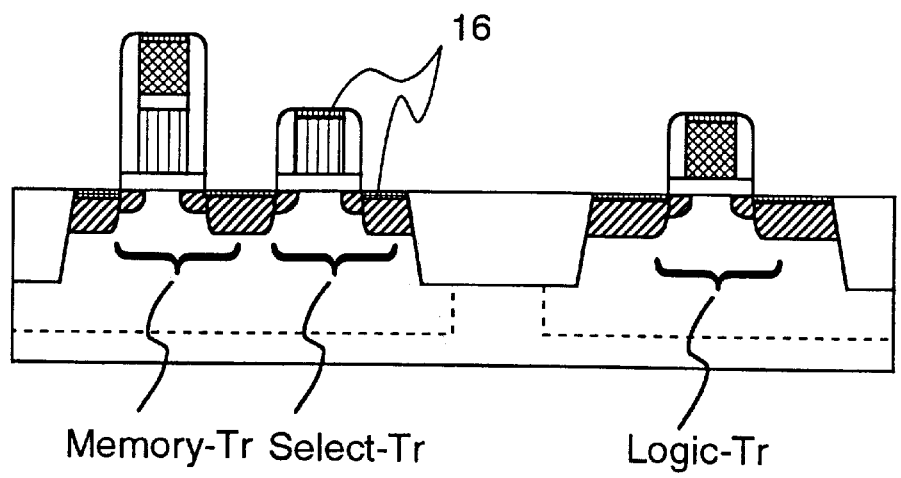
Figure 3:
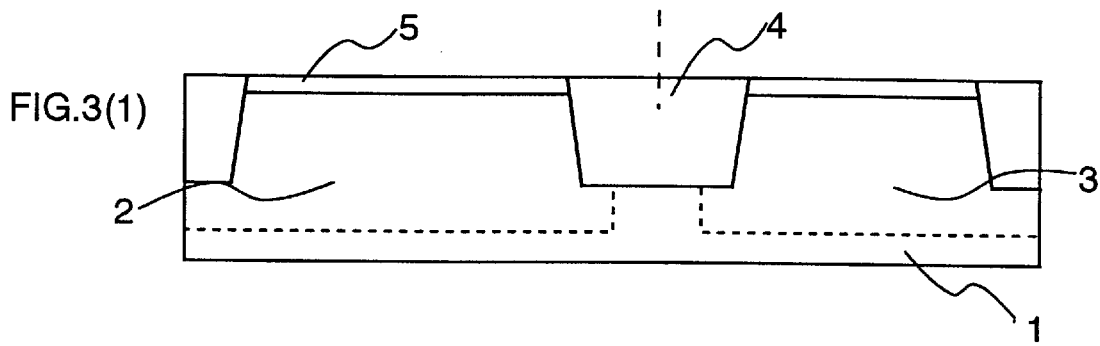
FIGS. 3(1) to 3(20) are a series of schematic cross-sectional views illustrating the steps of a conventional method of manufacturing a FLASHEEPROM.
Figure 3:
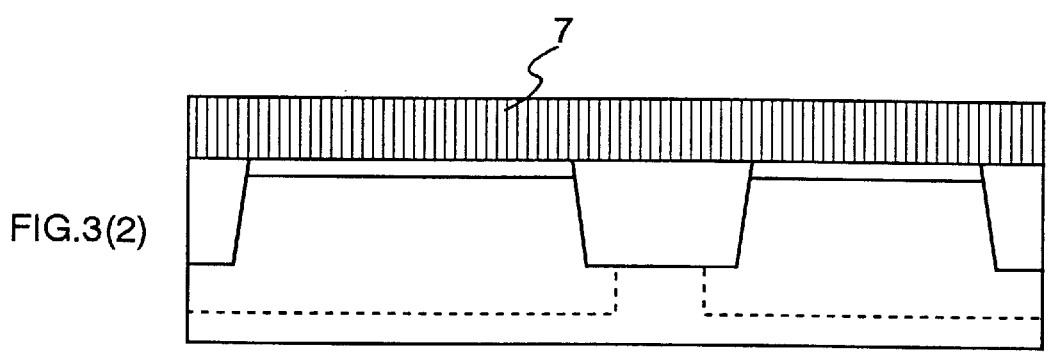
Figure 3:
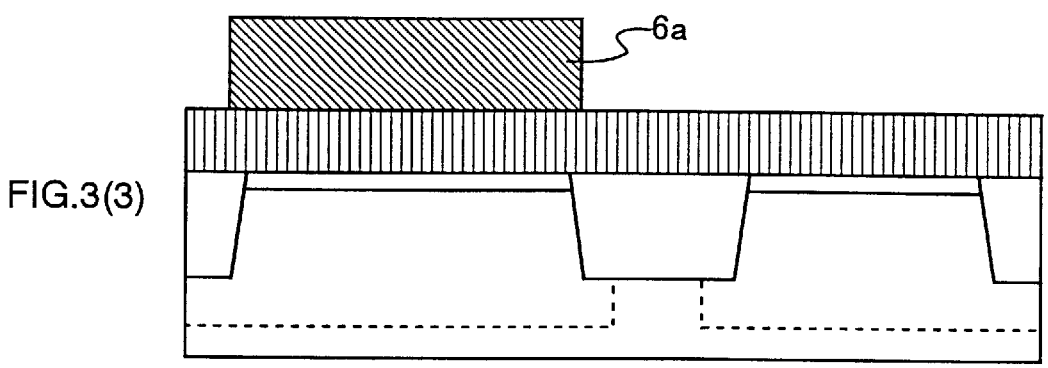
Figure 3:
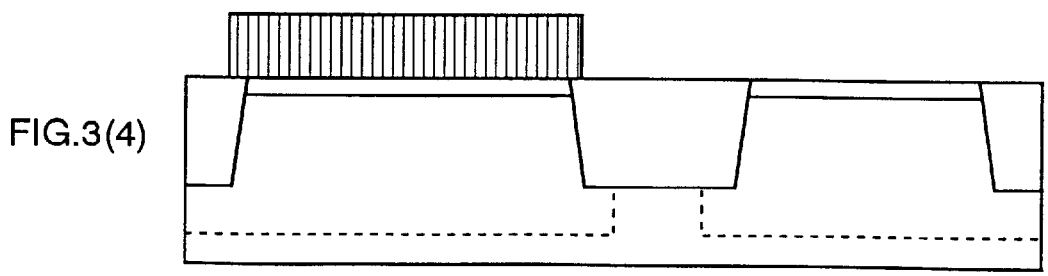
Figure 3:
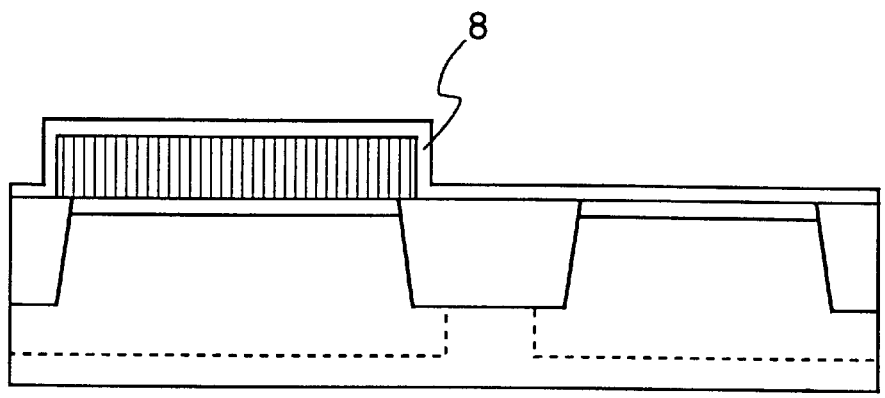
Figure 3:
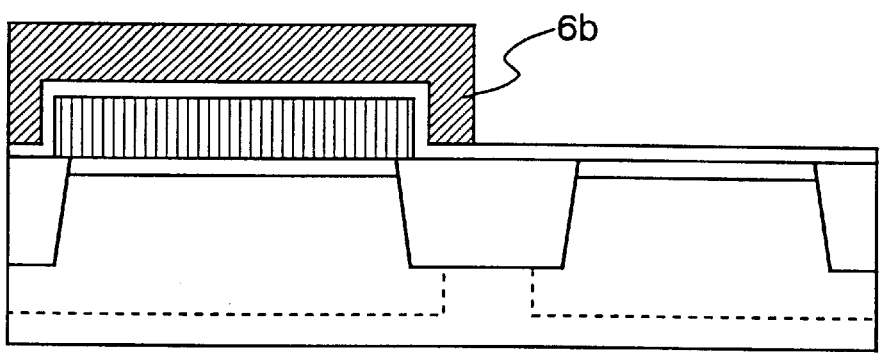
Figure 3:
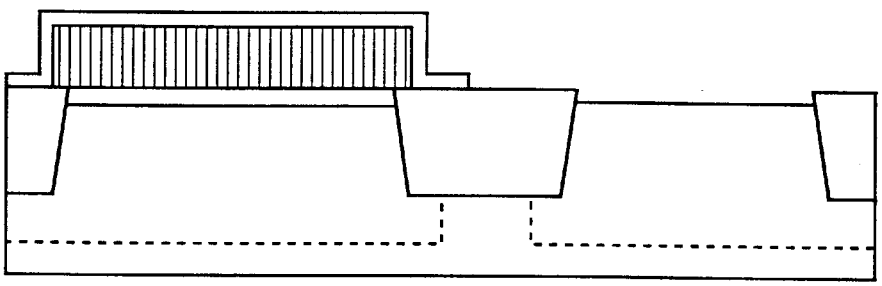
Figure 3:
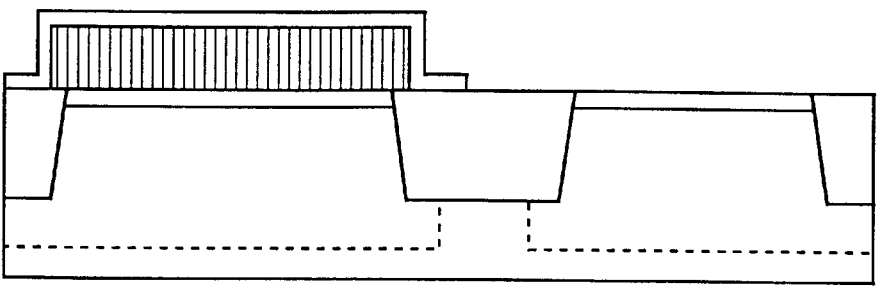
Figure 3:
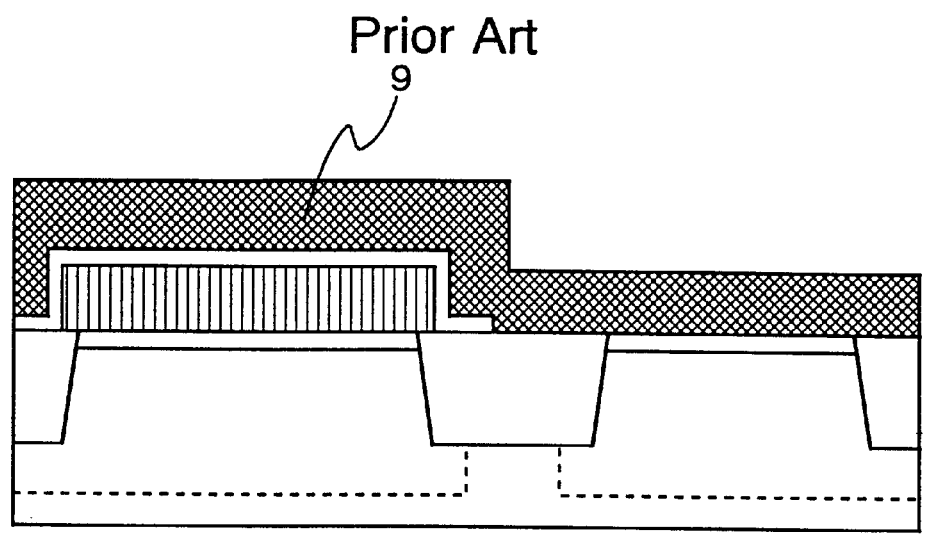
Figure 3:
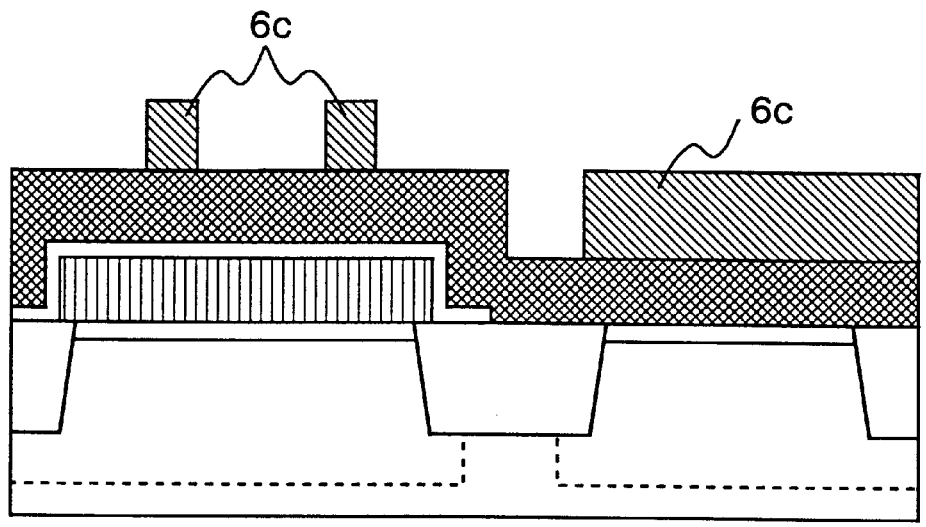
Figure 3:
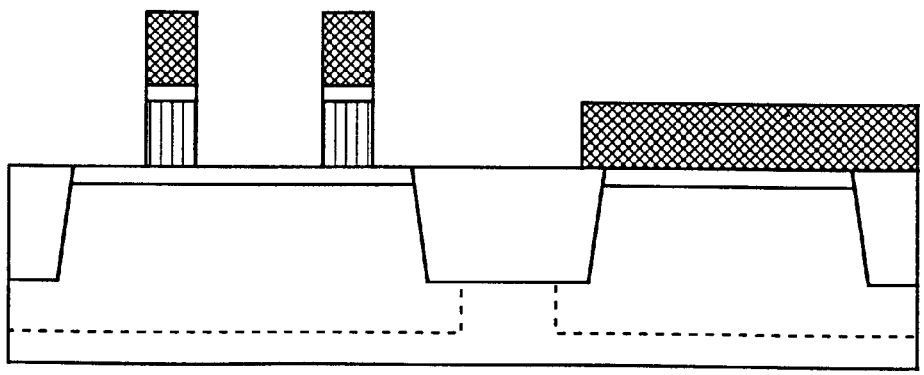
Figure 3:
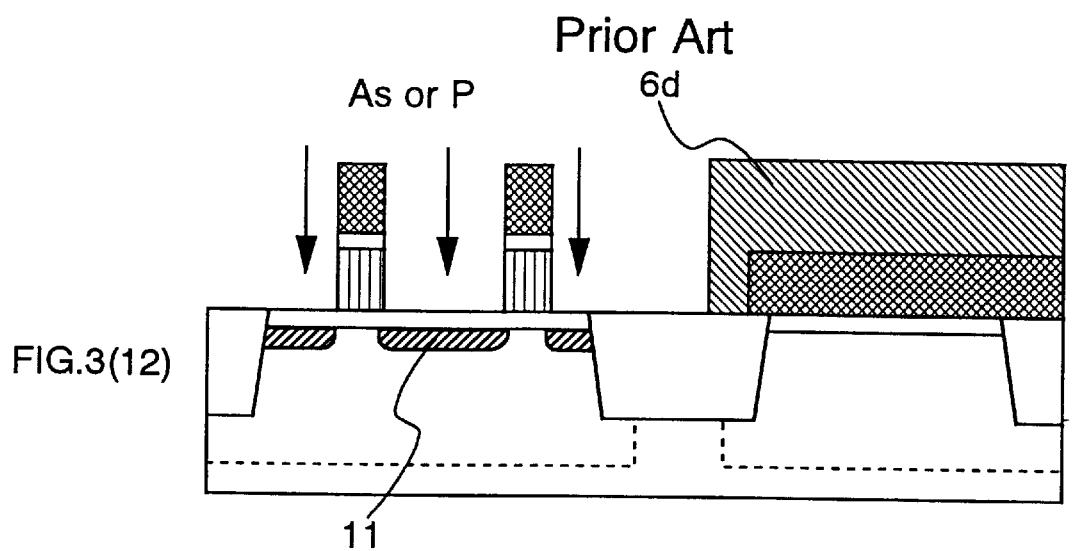
Figure 3:
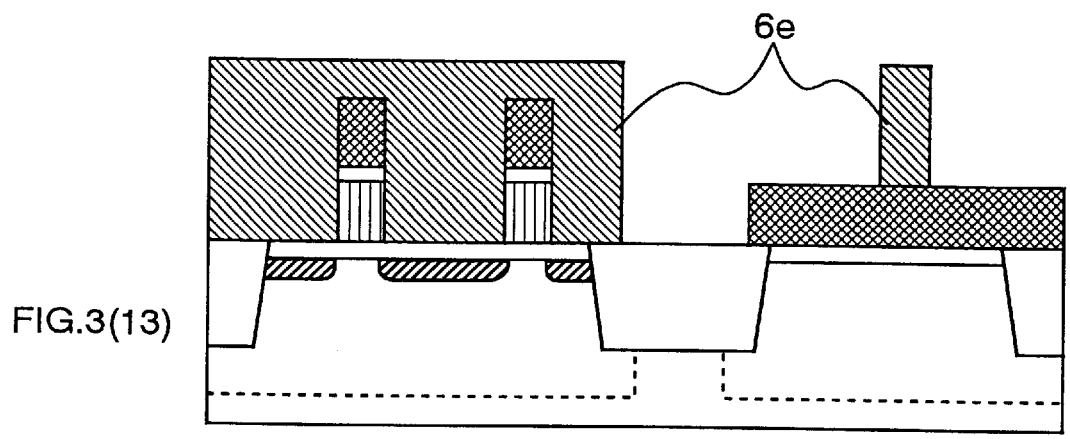
Figure 3:
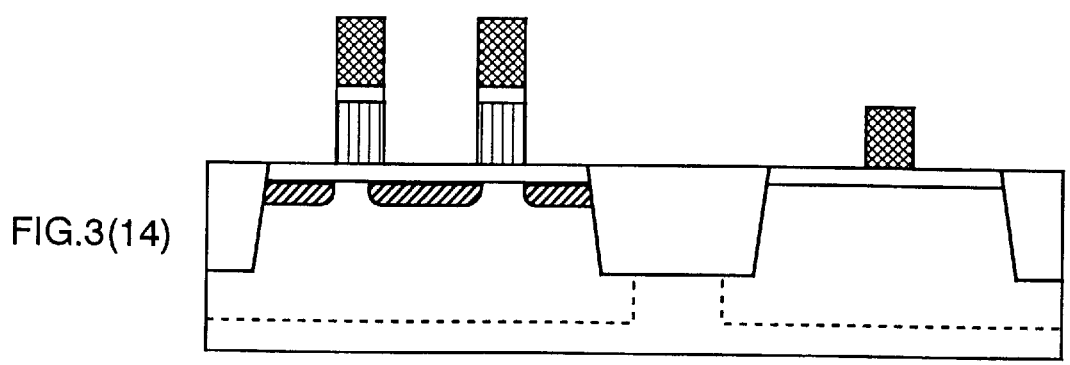
Figure 3:
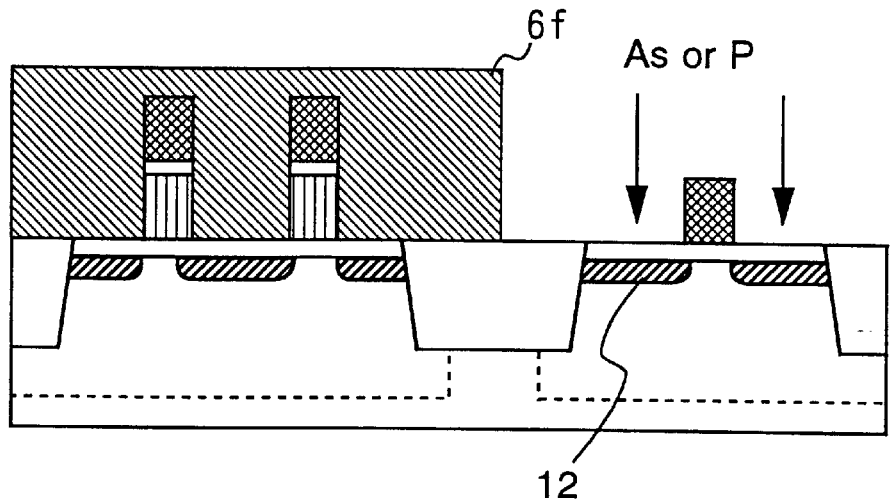
Figure 3:
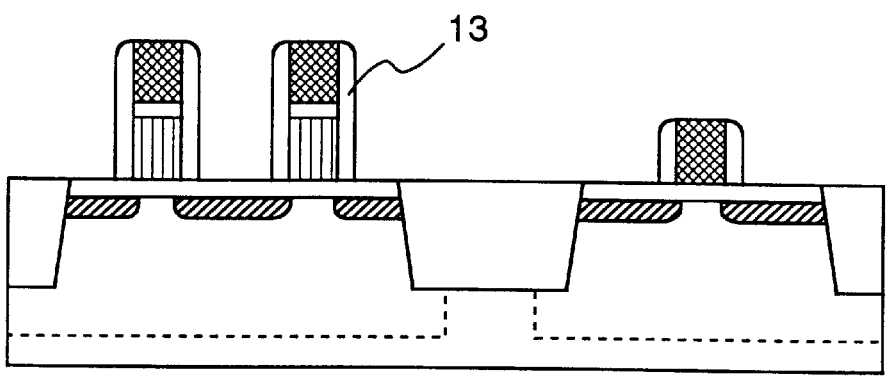
Figure 3:
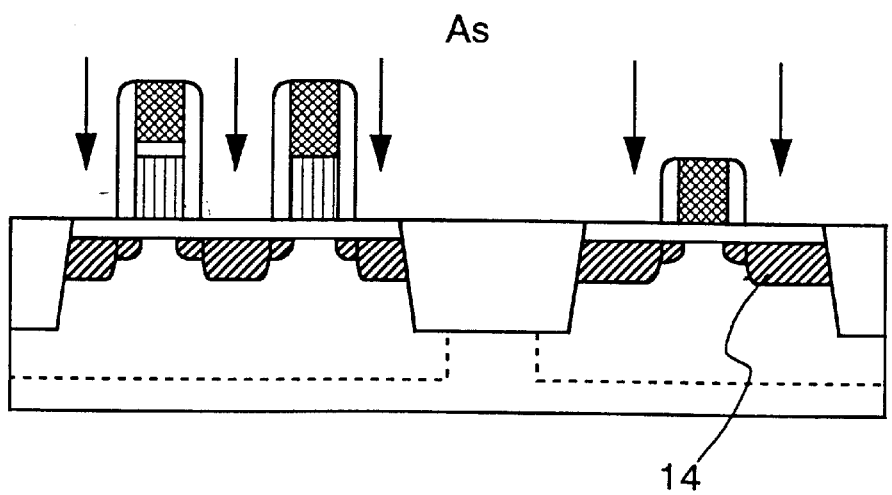
Figure 3:
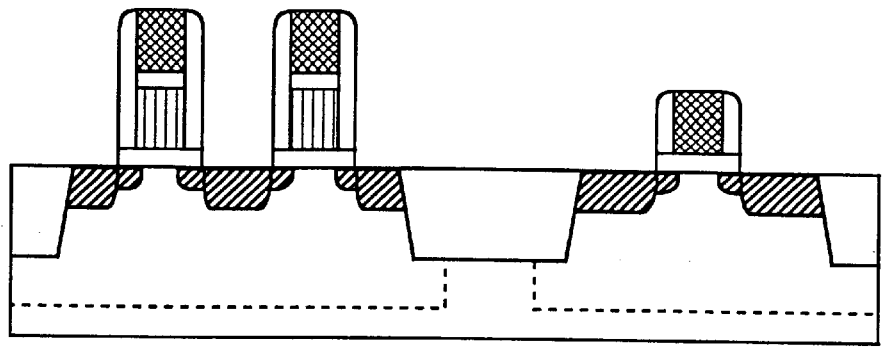
Figure 3:
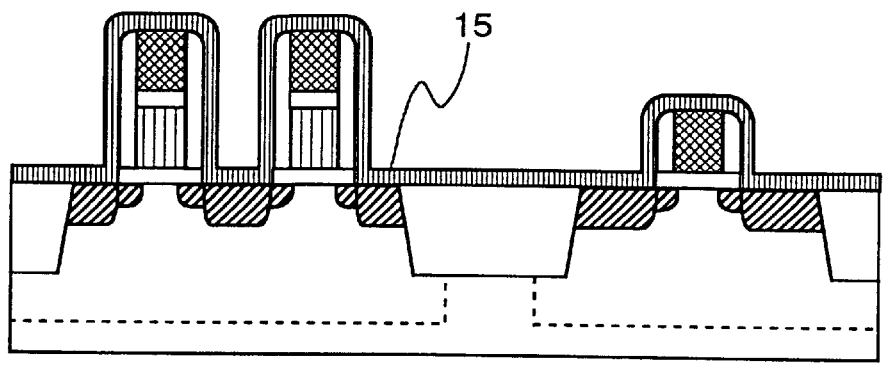
Figure 3:
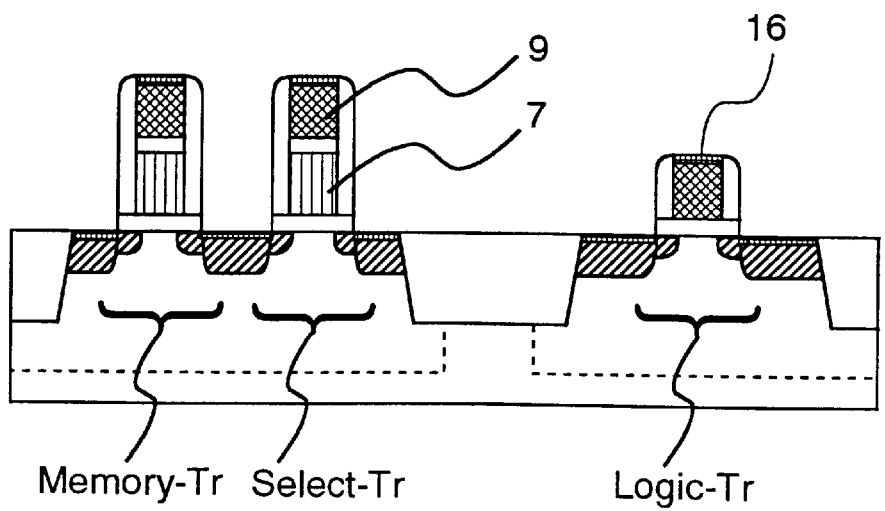

FIGS. 2(1) to 2(20) are a series of schematic cross-sectional views illustrating the steps of a method of manufacturing a FLASHEEPROM that is another embodiment of the present invention.

First, upon a P-type semiconductor substrate 1, a first P-well 2 and a second P-well 3 are formed in a flash memory area and a logic area, respectively. Next, a field oxide film 4 tat defines areas of elements is formed, and thereafter an oxide film 5 with a thickness of 8 to 10 nm is formed on the surface of the substrate 1 by the thermal oxidation method (FIG. 2(1)). Next, a first N⁻-type polysilicon 7 that is to become a FGE material in the flash memory area is formed thereon to a thickness of 150 nm (FIG. 2(2)). Alternatively, the polysilicon film may be grown to a thickness of 150 nm by performing the CVD method using $SiH_4$ and $PH_3$ or $AsH_3$, for example, as material gases and controlling the amount of the flow of the doping material so as to make the dopant concentration approximately $1 \times 10^{19}$ to $3 \times 10^{19}$ atoms/cm³. Next, in order to remove said first polysilicon film 7 lying outside of the flash memory area, a photoresist 6a is formed into the pattern on the oxide film in the flash memory area (FIG. 2(3)), and, using this as a mask, etching is applied thereto (FIG. 2(4)).

Next, covering remaining said polysilicon, an ONO film 8 is grown over the entire surface to a thickness of 12 to 16 nm in terms of oxide film thickness (FIG. 2(5)). To remove the ONO film in the logic area, a photoresist 6b is formed into the pattern over the flash memory area and then etching is applied thereto (FIG. 2(6)). At this, the oxide film on the surface of the substrate in the logic area is simultaneously removed (FIG. 2(7)) so that another oxide film (a gate oxide film) is subsequently formed again in the logic area by the thermal oxidation (FIG. 2(8)).

Over this, a second polysilicon 9 is grown to a thickness of 200 nm and then a nitride film 10 that is to serve as an etching mask for the ONO film and a floating gate in the later step is grown (FIG. 2(9)). Following that, a photoresist pattern 6c corresponding to the shape of an electrode of a memory-transistor in the flash memory area and the shape of an adjacent circuit transistor in the logic area is formed on said nitride film 10 (FIG. 2(10)), and then the nitride film 10 and the second polysilicon 9 are etched in succession (FIG. 2(11)).

After removing the photoresist, another resist pattern 6d is formed into the shape of a select-transistor gate as well as on the entire surface of the logic area. Then, using as a mask said nitride film in the memory-transistor area and the resist pattern, in the select-transistor area, the ONO film 8 and the first polysilicon 7 in the flash memory area are etched (FIG. 2(12)). Leaving the nitride film and the resist as they are, As or P is ion-implanted thereinto with a dose of $1 \times 10^{13}$ to $1 \times 10^{14}$ atoms/cm$^2$, in order to form a first LDD structure 11 in the flash memory area (FIG. 2(13)). After that, the photoresist, the ONO film lying on the gate of the select-transistor and finally the nitride film are removed in succession (FIG. 2(14)).

Next, for the formation of a second LDD 12 in the logic area, the entire surface of the flash memory area is covered with a photoresist 6 and, then, As or P is ion-implanted thereinto with a dose of approximately $1 \times 10^{13}$ to $1 \times 10^{14}$ atoms /cm$^2$ (FIG. 2(15)). After removing the photoresist, anoxide film is formed over the entire surface, and therefrom sidewalls 13 are formed on lateral faces of the electrode materials in the flash memory area and in the logic area (FIG. 2(16)). Following that, to form source-drain (SD) regions 14 in the flash memory area and in the logic area, As is ion-implanted thereinto with a dose of approximately $1 \times 10^{15}$ atoms/cm$^2$ (FIG. 2(17)).

Next, the oxide film lying outside of the transistors is all removed by wet etching (FIG. 2(18)) and then a titanium (Ti) film 15 is grown over the entire surface (FIG. 2(19)). Finally, by performing a salicide process in which titanium is turned to silicide and removing unreacted parts of the Ti film 15 subsequently, silicide films 16 are selectively formed on the SD regions of the P-type substrate 1 as well as on the polysilicons of the transistors, and thereby a semiconductor device having a memory-transistor (Tr) and a select-transistor (Tr) in the flash memory area and a logic-transistor (Tr) in the logic area is accomplished (FIG. 2(20)).

Further, while, in the above description, a semiconductor device having an N-channel structure is taken as an example, it is to be understood that the present invention may be applied to the one having a P-channel structure or a CMOS (Complementary Metal-Oxide-Semiconductor) structure.

What is claimed is:

1. A method of manufacturing a nonvolatile memory semiconductor device having, on one and the same substrate, a flash memory area where a memory-transistor and a select-transistor are formed and a logic area where an adjacent circuit transistor is formed; which, at least, comprises the steps of:

(1) growing an N$^-$-type first polysilicon upon a semiconductor substrate on which an element isolation region and an oxide film are formed;

(2) removing the first polysilicon overlying the element isolation region by etching;

(3) growing a first insulating film over the entire surface so as to cover the remaining first polysilicon;

(4) growing a second polysilicon as well as a nitride film over the entire surface;

(5) forming a resist pattern at the position where electrodes of the memory-transistor are to be formed and, then, with said pattern used as a mask, carrying out etching of the nitride film, the second polysilicon and the first polysilicon;

(6) removing the resist pattern, and thereafter forming another resist pattern at the positions where electrodes of the select-transistor and the adjacent circuit transistor are to be formed and, then, with said nitride film used as a mask for the memory-transistor and said pattern, for the select-transistor and the adjacent circuit transistor, carrying out etching of the first polysilicon;

(7) removing said nitride film as well as said resist pattern, and thereafter, concurrently with forming source-drain regions, applying ion implantation to the second polysilicon which is to serve as a control gate of the memory-transistor and to the first polysilicon which is to serve as gate electrodes of the select-transistor and of the adjacent circuit transistor in the logic area; and (8) removing, by means of isotropic etching, the oxide film lying on the substrate surface other than the parts thereof underlying every transistor, to the level where the substrate surface is exposed.

2. The method of manufacturing a semiconductor device according to claim 1, which further comprises the step of injecting dopants by ion implantation after growing said N$^-$-type first polysilicon.

3. The method of manufacturing a semiconductor device according to claim 1, which, after said step (8), further comprises the step of:

(9) growing a metal film over the entire surface for the silicide formation, and thereafter subjecting that to the chemical change to silicide and then removing the unreacted metal film.

4. The method of manufacturing a semiconductor device according to claim 1, wherein said step (7) comprises the sub-steps of removing said nitride film as well as resist pattern and then performing the first ion implantation to form an LDD structure in the flash memory area, with another resist masking the entire surface of the logic area; removing the resist in the logic area and then performing the second ion implantation to form an LDD structure in the logic area, with another resist masking the entire surface of the flash memory area; and, in addition, forming sidewalls prior to another ion implantation to form source-drain regions.

* * * * *